United States Patent
Yu et al.

(10) Patent No.: US 12,087,388 B2
(45) Date of Patent: Sep. 10, 2024

(54) METHOD OF PERFORMING INTERNAL PROCESSING OPERATIONS WITH PRE-DEFINED PROTOCOL INTERFACE OF MEMORY DEVICE

(71) Applicant: SAMSUNG ELECTRONICS CO., LTD., Suwon-si (KR)

(72) Inventors: Hak-Soo Yu, Hanam-si (KR); Namsung Kim, Yongin-si (KR); Kyomin Sohn, Yongin-si (KR); Seongil O, Suwon-si (KR); Sukhan Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/504,918

(22) Filed: Oct. 19, 2021

(65) Prior Publication Data
US 2022/0036929 A1    Feb. 3, 2022

Related U.S. Application Data

(63) Continuation of application No. 16/813,851, filed on Mar. 10, 2020, now Pat. No. 11,158,357.

(30) Foreign Application Priority Data

Dec. 6, 2019  (KR) .................. 10-2019-0161673

(51) Int. Cl.
*G11C 7/10* (2006.01)
*G11C 5/02* (2006.01)
(Continued)

(52) U.S. Cl.
CPC ............ *G11C 7/1045* (2013.01); *G11C 5/025* (2013.01); *G11C 7/1039* (2013.01); *G11C 11/4087* (2013.01); *G11C 11/409* (2013.01)

(58) Field of Classification Search
CPC ..... G11C 7/1045; G11C 7/1039; G11C 5/025; G11C 11/4087; G11C 11/409; G11C 8/12; G11C 5/063; G11C 7/109; G11C 7/1006
See application file for complete search history.

(56) References Cited

U.S. PATENT DOCUMENTS

| 4,443,850 | A | 4/1984 | Harris |
| 5,396,641 | A * | 3/1995 | Iobst .................. G06F 15/7821 710/100 |

(Continued)

FOREIGN PATENT DOCUMENTS

| CN | 102460406 | 5/2012 |
| CN | 107450890 | 12/2017 |

(Continued)

OTHER PUBLICATIONS

Office Action dated Aug. 29, 2022 in Related U.S. Appl. No. 16/814,462.

(Continued)

*Primary Examiner* — Ajay Ojha
(74) *Attorney, Agent, or Firm* — F. Chau & Associates, LLC

(57) ABSTRACT

A memory device includes a memory cell array, signal lines, a mode selector circuit, a command converter circuit, and an internal processor. The memory cell array includes first and second memory regions. The mode selector circuit is configured to generate a processing mode selection signal for controlling the memory device to enter an internal processing mode based on the address received together with the command. The command converter circuit is configured to convert the received command into an internal processing (Continued)

operation command in response to activation of the internal processing mode selection signal. The internal processor is configured to perform an internal processing operation on the first memory region in response to the internal processing operation command, in the internal processing mode.

20 Claims, 9 Drawing Sheets

Related U.S. Application Data

(60) Provisional application No. 62/816,509, filed on Mar. 11, 2019.

(51) Int. Cl.
  *G11C 11/408* (2006.01)
  *G11C 11/409* (2006.01)

(56) References Cited

U.S. PATENT DOCUMENTS

| | | |
|---|---|---|
| 5,539,891 A | 7/1996 | Childers |
| 5,678,021 A | 10/1997 | Pawate et al. |
| 6,237,079 B1 | 3/2001 | Stoney |
| 6,564,271 B2 | 5/2003 | Micalizzi, Jr. et al. |
| 7,592,829 B2 | 9/2009 | Walmsley et al. |
| 8,234,460 B2 | 7/2012 | Walker |
| 9,268,704 B2 | 2/2016 | Fleischer et al. |
| 9,324,458 B2 | 4/2016 | Kim et al. |
| 9,329,804 B2 | 5/2016 | Lassa |
| 9,535,876 B2 | 1/2017 | Walker |
| 9,953,702 B2 | 4/2018 | Son |
| 10,013,734 B1 | 7/2018 | Boles et al. |
| 10,061,590 B2 | 8/2018 | Wheeler et al. |
| 10,083,722 B2 | 9/2018 | Oh et al. |
| 10,180,906 B2 | 1/2019 | Stocksdale et al. |
| 10,318,168 B2 | 6/2019 | Lea et al. |
| 10,592,467 B2 | 3/2020 | Ryu et al. |
| 10,725,685 B2 | 7/2020 | Greiner et al. |
| 10,970,441 B1 | 4/2021 | Zhang et al. |
| 2004/0193842 A1 | 9/2004 | Kirsch |
| 2006/0036779 A1 | 2/2006 | Kim et al. |
| 2010/0241791 A1 | 9/2010 | Iwashiro et al. |
| 2010/0312998 A1 | 12/2010 | Walker |
| 2011/0093662 A1 | 4/2011 | Walker et al. |
| 2011/0093665 A1 | 4/2011 | Walker et al. |
| 2011/0231827 A1 | 9/2011 | Kilbane |
| 2012/0215991 A1 | 8/2012 | Moyer |
| 2013/0036314 A1 | 2/2013 | Glew et al. |
| 2013/0169642 A1 | 7/2013 | Frascati et al. |
| 2014/0115278 A1 | 4/2014 | Redford et al. |
| 2014/0136811 A1 | 5/2014 | Fleischer et al. |
| 2014/0215185 A1 | 7/2014 | Danielsen |
| 2014/0281149 A1 | 9/2014 | Roberts et al. |
| 2015/0046660 A1 | 2/2015 | Kim |
| 2016/0041856 A1 | 2/2016 | Sankaralingam et al. |
| 2016/0283232 A1 | 9/2016 | Sade et al. |
| 2017/0168746 A1 | 6/2017 | Kwon et al. |
| 2017/0177498 A1 | 6/2017 | Wilkes |
| 2017/0278584 A1 | 9/2017 | Rosti |
| 2017/0344301 A1 | 11/2017 | Ryu et al. |
| 2017/0344480 A1 | 11/2017 | Beard et al. |
| 2018/0024926 A1 | 1/2018 | Penney et al. |
| 2018/0032458 A1 | 2/2018 | Bell |
| 2018/0107406 A1 | 4/2018 | O et al. |
| 2018/0239712 A1 | 8/2018 | Lea |
| 2018/0276539 A1 | 9/2018 | Lea |
| 2018/0329832 A1 | 11/2018 | Takaku et al. |
| 2019/0034097 A1 | 1/2019 | Chang et al. |
| 2019/0065111 A1 | 2/2019 | Lea et al. |
| 2019/0074048 A1 | 3/2019 | Kwak et al. |
| 2019/0079678 A1 | 3/2019 | Malladi et al. |
| 2019/0138893 A1 | 5/2019 | Sharma et al. |
| 2019/0198082 A1 | 6/2019 | O |
| 2019/0258487 A1 | 8/2019 | Shin et al. |
| 2020/0020393 A1 | 1/2020 | Al-Shamma |
| 2020/0035291 A1 | 1/2020 | Kasibhatla |
| 2020/0294558 A1 | 9/2020 | Yu et al. |

FOREIGN PATENT DOCUMENTS

| | | |
|---|---|---|
| CN | 107767919 | 12/2017 |
| CN | 107958679 | 4/2018 |
| CN | 109147842 | 1/2019 |
| CN | 109196485 | 1/2019 |
| CN | 109378203 | 2/2019 |
| JP | 2003122566 | 4/2003 |
| KR | 10-2017-0136055 | 12/2017 |
| KR | 10-2017-0138926 | 12/2017 |
| KR | 10-2018-0042111 | 4/2018 |
| KR | 10-1867219 | 6/2018 |
| TW | 201802692 | 1/2018 |
| TW | 201804328 | 2/2018 |
| TW | 201832083 | 9/2018 |

OTHER PUBLICATIONS

Office Action dated Jul. 11, 2022 in Related U.S. Appl. No. 16/814,236.
Office Action dated Feb. 12, 2021 in related U.S. Appl. No. 16/814,462.
Office Action dated Feb. 23, 2022 in Related U.S. Appl. No. 16/814,236.
Office Action dated Nov. 26, 2021 in related U.S. Appl. No. 16/814,462.
Wikipedia entry entitled Program Counter. 5 pages, last edited on Oct. 28, 2020. Accessed Nov. 19, 2021. Retrieved from Internet <https://en.wikipedia.org/wiki/Program_counter>.
Chi P. et al., Prime: A Novel Processing-in-Memory Architecture for Neural Network Computation in ReRAM-Based Main Memory. 2016 ACM/IEEE 43rd Annual International Symposium on Computer Architecture (ISCA), Jun. 18, 2016, vol. 44, No. 3, pp. 27-39.
First Office Action dated Apr. 28, 2023 in corresponding SG Patent Application No. 10202002213R.
First Office Action dated Jun. 22, 2024 in corresponding SG Patent Application No. 10202002232U.
Examination Report dated Aug. 8, 2023 from Intellectual Property India in corresponding IN Application No. 202044010377.
Final Written Opinion dated Jul. 3, 2023 in corresponding SG Patent Application No. 10202002231W.
1st Written Opinion dated Jun. 22, 2023 in corresponding SG Patent Application No. 10202002232U.
First Office Action issued Sep. 21, 2023 in corresponding CN Patent Application No. 20200149237.1.
1st Office Action dated Dec. 13, 2023 in corresponding IN Patent Application No. 202044010294.
Official Communication issued Mar. 22, 2024 in corresponding TW Patent Application No. 109107592.
1st Office Action dated Apr. 20, 2024 in corresponding CN Patent Application No. 202010147089.X.
1st Office Action dated Jun. 6, 2024 in corresponding CN Patent Application No. 20201065017.8.
Office Action dated Jun. 17, 2024 in corresponding KR Patent Application No. 10-2019-0161673.

* cited by examiner

METHOD OF PERFORMING INTERNAL PROCESSING OPERATIONS WITH PRE-DEFINED PROTOCOL INTERFACE OF MEMORY DEVICE

CROSS-REFERENCE TO RELATED APPLICATIONS

This U.S. non-provisional patent application is a continuation application of U.S. patent application Ser. No. 16/813,851 filed Mar. 10, 2020, which claims the benefit of priority to U.S. provisional application No. 62/816,509, filed on Mar. 11, 2019, in the United States Patent and Trademark Office and Korean Patent Application No. 10-2019-0161673, filed on Dec. 6, 2019, in the Korean Intellectual Property Office, the disclosures of which are incorporated by reference in their entireties herein.

BACKGROUND

1. Technical Field

The inventive concept relates to apparatuses and methods, and more particularly, to a memory device that performs an internal processing operation by using a pre-defined protocol interface, a method of operating the memory device, and a memory system including the memory device.

2. Discussion of Related Art

High performance applications and graphics algorithms are data-intensive and compute-intensive. Applications that execute deep neural networks require a computing system with large computational and memory capabilities to accurately train or learn different data sets. A personal-in-memory (PIM) type processor may be located within a memory device to perform some computational operations of a computing system as internal processing. Through the internal processing of the memory device, the computational operation load of the computing system may be reduced.

However, when a separate interface for the internal processing is required, hardware configurations of the memory device may become complicated to implement. Thus, costs for supporting internal processing operations may increase.

SUMMARY

At least one exemplary embodiment of the inventive concept provides a memory device for performing an internal processing operation by using a pre-defined protocol interface, a method of operating the memory device, and a memory system including the memory device.

According to an exemplary embodiment of the inventive concept, there is provided a memory device including a memory cell array including a first memory region and a second memory region; signal lines (e.g., command/address signal lines) configured to receive a command and an address from a source located outside the memory device; mode selector circuit configured to generate a processing mode selection signal for controlling the memory device to enter an internal processing mode based on the address received together with the command; a command converter circuit configured to convert the received command into an internal processing operation command in response to activation of the internal processing mode selection signal; and an internal processor configured to perform an internal processing operation on the first memory region in response to the internal processing operation command, in the internal processing mode.

According to an exemplary embodiment of the inventive concept, there is provided a method of operating a memory device including a memory cell array including a first memory region and a second memory region, and an internal processor configured to perform an internal processing operation, the method including receiving a command and an address from a source located outside the memory device through a pre-defined protocol interface; generating a processing mode selection signal for controlling the memory device to enter an internal processing mode based on the address received together with the command; converting the received command into an internal processing operation command in response to activation of the internal processing mode selection signal; and the internal processor performing an internal processing operation on the first memory region in response to the internal processing operation command, in the internal processing mode.

According to exemplary embodiment of the inventive concept, there is provided a memory system including a memory device; and a memory controller configured to control the memory device by using a pre-defined protocol interface connected to the memory device. The memory device includes a memory cell array including a first memory region and a second memory region; an mode selector circuit configured to receive a command and an address from the memory controller through the pre-defined protocol interface and, based on the address received together with the command, generate a processing mode selection signal for controlling the memory device to enter an internal processing mode; a command converter circuit configured to convert the received command into an internal processing operation command in response to activation of the internal processing mode selection signal; and an internal processor configured to perform an internal processing operation on the first memory region in response to the internal processing operation command, in the internal processing mode.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EXEMPLARY EMBODIMENTS

Figure 1:
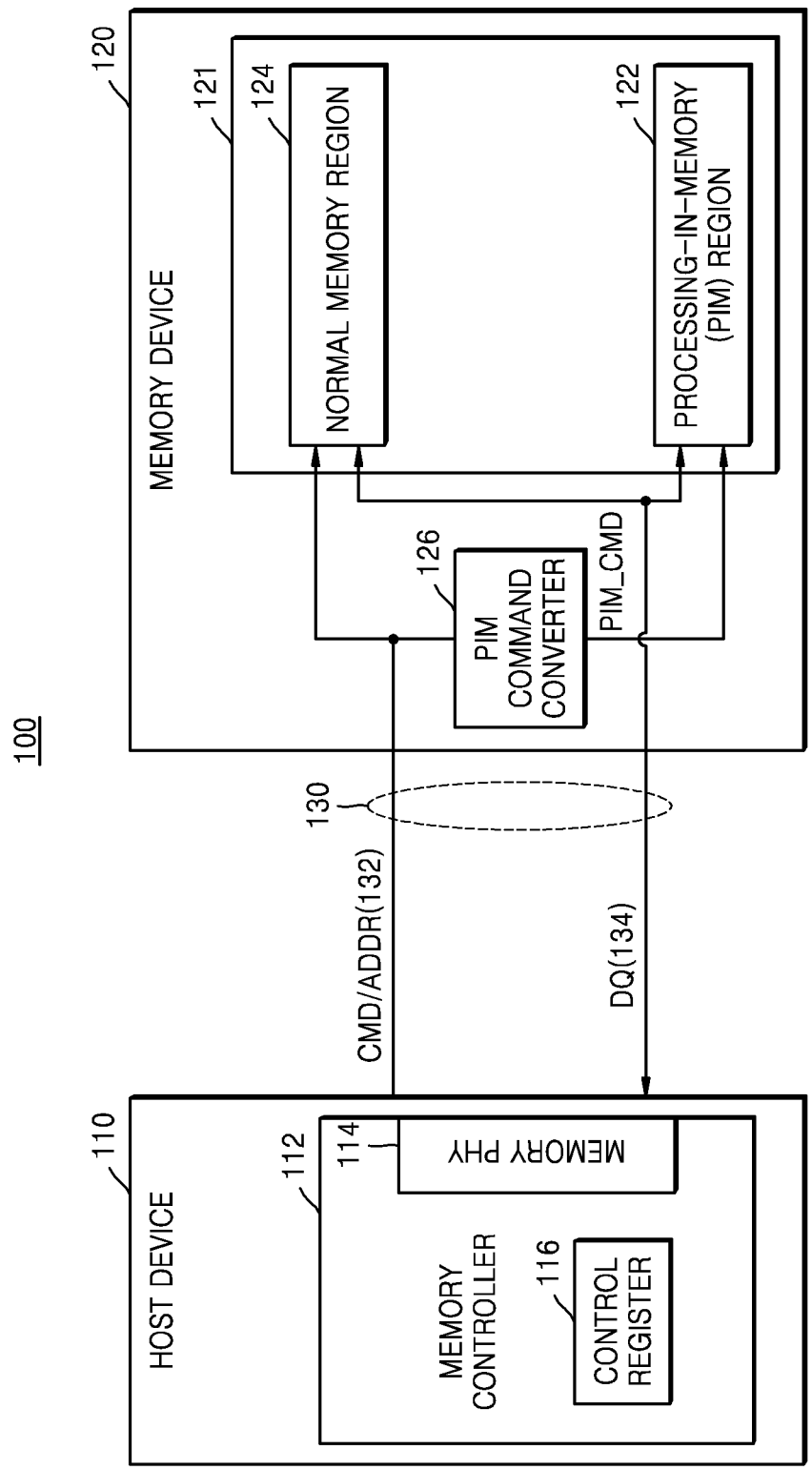
FIG. 1 is a diagram showing a system including a memory device that performs an internal processing operation according to an exemplary embodiment of the inventive concept.

FIG. 1 is a diagram showing a system including a memory device that performs an internal processing operation according to exemplary embodiment of the inventive concept.

Referring to FIG. 1, a system 100 includes a host device 110 and a memory device 120. The host device 110 may be communicatively connected to the memory device 120 via a memory bus 130.

Some examples may be described using the expression "connected" and/or "coupled" along with their derivatives. These terms are not necessarily intended as synonyms for each other. For example, descriptions using the terms "connected" and/or "coupled" may indicate that two or more elements are in direct physical or electrical contact with each other. In addition, the terms "connected" and/or "coupled" may also mean that two or more elements are not in direct contact with each other but still cooperate or interact with each other.

The host device 110 may be, for example, a computing system like a computer, a laptop computer, a server, a workstation, a portable communication terminal, a personal digital assistant (PDA), a portable multimedia player (PMP), a smart phone, or a wearable device. Alternatively, the host device 110 may be one of a plurality of components included in a computing system, e.g., a graphics card.

The host device 110 is a functional block for performing general computer operations in the system 100 and may correspond to a central processing unit (CPU), a digital signal processor (DSP), a graphics processing unit (GPU), or an application processor (AP). The host device 110 may include a memory controller 112 (e.g., a control circuit) that manages data transmission and reception to and from the memory device 120.

The memory controller 112 may access the memory device 120 according to a memory request of the host device 110. The memory controller 112 includes a memory physical layer interface 114 for interfacing with the memory device 120. For example, the memory controller 112 may be used for selecting rows and columns corresponding to memory locations, writing data to memory locations, or reading written data. The memory physical layer interface 114 may be referred to as a memory PHY 114.

The memory controller 112 includes a control register 116. The control register 116 may be used for initializing the memory device 120 and/or controlling the memory device 120 according to operating characteristics of the memory device 120. After the system 100 is powered up, the memory controller 112 may set the control register 116. The control register 116 may store various codes configured to allow the memory controller 112 to normally interoperate with the memory device 120. For example, codes indicating a frequency, a timing, and detailed operation parameters of the memory device 120 may be stored in the control register 116. Also, the control register 116 may store specific address information used by the controller 112 to physically or logically divide a memory cell array 121 of the memory device 120 according to an operation mode.

For example, the specific address information may indicate specific addresses used to divide the memory cell array 121 into a PIM region 122 and a normal memory region 124.

The PIM region 122 may be a memory cell region accessed when the memory device 120 operates in an internal processing mode, and the normal memory region may be a memory cell region accessed when the memory device 120 operates in a normal mode. For example, a specific address may indicate an address used to access the PIM region 122 and may serve as a basic signal for allowing the memory device 120 to enter the internal processing mode. A specific address may include, for example, a stack identification signal, a channel address, or a bank address. According to embodiments, the specific address may include a combination of a stack identification signal, a channel address, and/or a bank address.

The memory controller 112 may control a write operation or a read operation for the memory device 120 by providing a command CMD (e.g., a read command, a write command, a verify command, etc.) and an address ADDR to the memory device 120. Also, data DQ to be written and read data DQ may be transmitted and received between the memory controller 112 and the memory device 120. The data DQ may be transmitted from the memory controller 112 to the memory device 120, the memory device 120 may receive the transmitted data DQ, and then the memory device 120 may write the received data DQ to the memory cell array 121 during a first memory access operation. The memory device 120 may read the data DQ from the memory cell array 121, the memory device 120 may transmit the read data DQ to the memory controller 112, and then the memory controller 112 may receive the transmitted data DQ during a second memory access operation. Such a memory access operation may be performed through the memory PHY 114 and the memory bus 130 between the memory controller 112 and the memory device 120.

The memory PHY 114 is a physical or electrical layer and a logical layer provided for signals, frequencies, timings, detailed operation parameters, and functionality needed for an efficient communication between the memory controller 112 and the memory device 120. The memory PHY 114 may support the features of a double data rate (DDR) protocol and/or a low power double data rate (LPDDR) protocol of the Joint Electron Device Engineering Council (JEDEC) standard.

The memory PHY 114 may include connectors for connecting the memory controller 110 and the memory device 120. The connectors may be implemented as pins, balls, signal lines, or other hardware components. For example, a clock signal CK (FIG. 7), a command CMD, an address ADDR, and data DQ may be transmitted and received between the memory controller 110 and the memory device 120 through the memory PHY 114.

Reuse of existing connectors in the memory PHY 114 may save significant space in an integrated circuit IC and avoid the cost for extending additional wires to the memory device 120. Also, avoiding additional pins and wires eliminates potential electro-magnetic interference (EMI) due to the presence of additional wires and, since large numbers of drivers and receivers are not needed, power conservation may be realized.

The memory bus 130 may include command/address signal lines 132 for transmitting command/address CMD/ADDR and data lines 134 for transmitting the data DQ. For simplicity of the drawings, it is illustrated that the command/address signal lines 132 and the data lines 134 are single lines between the memory controller 110 and the memory device 120, but the command/address signal lines 132 and the data lines 134 may actually be a plurality of signal lines.

The memory device 120 may write data or read data under the control of the memory controller 112. For example, the memory device 120 may be a DDR synchronous dynamic random access memory (SDRAM) device. However, the inventive concept is not limited thereto, and the memory device 120 may be any one of volatile memory devices like an LPDDR SDRAM, a wide I/O DRAM, a high bandwidth memory (HBM), and a hybrid memory cube (HMC). According to embodiments, the memory device 120 may be any one of non-volatile memory devices like a flash memory, a phase-change RAM (PRAM), a magnetic RAM (MRAM), a resistive RAM (RRAM), and a ferroelectric RAM (FRAM).

In an exemplary embodiment of the inventive concept, the memory device 120 operates in one of the normal mode and the internal processing mode. The normal mode refers to an operation mode for performing a general data transaction operation, and the internal processing mode refers to an operation mode for performing an internal processing operation.

In the normal mode, the memory device 120 performs a general data transaction operation under the control of the memory controller 112. A general data transaction operation is a data exchange operation performed according to a predefined protocol like the DDR protocol and/or the LPDDR protocol.

In the internal processing mode, the memory device 120 performs an internal processing operation under the control of the memory controller 112. The memory controller 112 may provide a specific address, which is the basis of an internal processing operation to be performed by the memory device 120, to the memory device 120 through the command/address signal lines 132 by using a predefined protocol like the DDR protocol and/or the LPDDR protocol. The memory device 120 may enter the internal processing mode based on the specific address. The specific address may be provided via an existing connector of the memory PHY 114.

For example, the specific address, which is the basis of an internal processing operation, may be statically set when the memory device 120 is mounted in the system 100. Static setting means that the specific address may be fixed by using one specific address information. According to an exemplary embodiment, the specific address is dynamically set before and after an internal processing operation of the memory device 120. The specific address may be changed by using various combinations of specific address information during a dynamic setting.

The memory device 120 includes the memory cell array 121 and a PIM command converter 126 (e.g., a processor or a logic circuit). The memory cell array 121 includes the PIM region 122 and the normal memory region 124 that are physically or logically divided according to an operation mode of the memory device 120.

The PIM region 122 may refer to a memory cell region configured to access internal processing data for an internal processing operation performed in the internal processing mode. Internal processing operations of the memory device 120 may include a write operation to the PIM region 122 and/or a read operation from the PIM region 122.

The normal memory region 124 may refer to a memory cell region configured to access data according to a general data transaction operation performed in the normal mode. Data transaction operations of memory device 120 may include a write operation to the normal memory region 124 and/or a read operation from the normal memory region 124.

When the address ADDR received through the command/address signal lines 132 includes a specific address that is the basis of an internal processing operation, the PIM command converter 126 converts the command CMD received through the command/address signal lines 132 into an internal processing operation command PIM_CMD. For example, the PIM command converter 126 may convert the command CMD received through the command/address signal lines 132 into the internal processing operation command PIM_CMD instructing a type of internal processing operation (e.g., data search, data arithmetic operation (e.g., add, subtract, multiple, divide, etc.), data move, data inversion, data shift, data swap, data comparison, logical operations, data processing/operations, etc.). The internal processing operation command PIM_CMD may include an internal processing read command and/or an internal processing write command associated with an internal processing operation.

An internal processing operation for reading internal processing data from the PIM region 122 or writing internal processing data to the PIM region 122 may be performed according to the internal processing operation command PIM_CMD. The internal processing data may refer to reference data or target data used in an internal processing operation. Also, the internal processing data may include address information related to an internal processing operation like a data swap.

Figure 2:
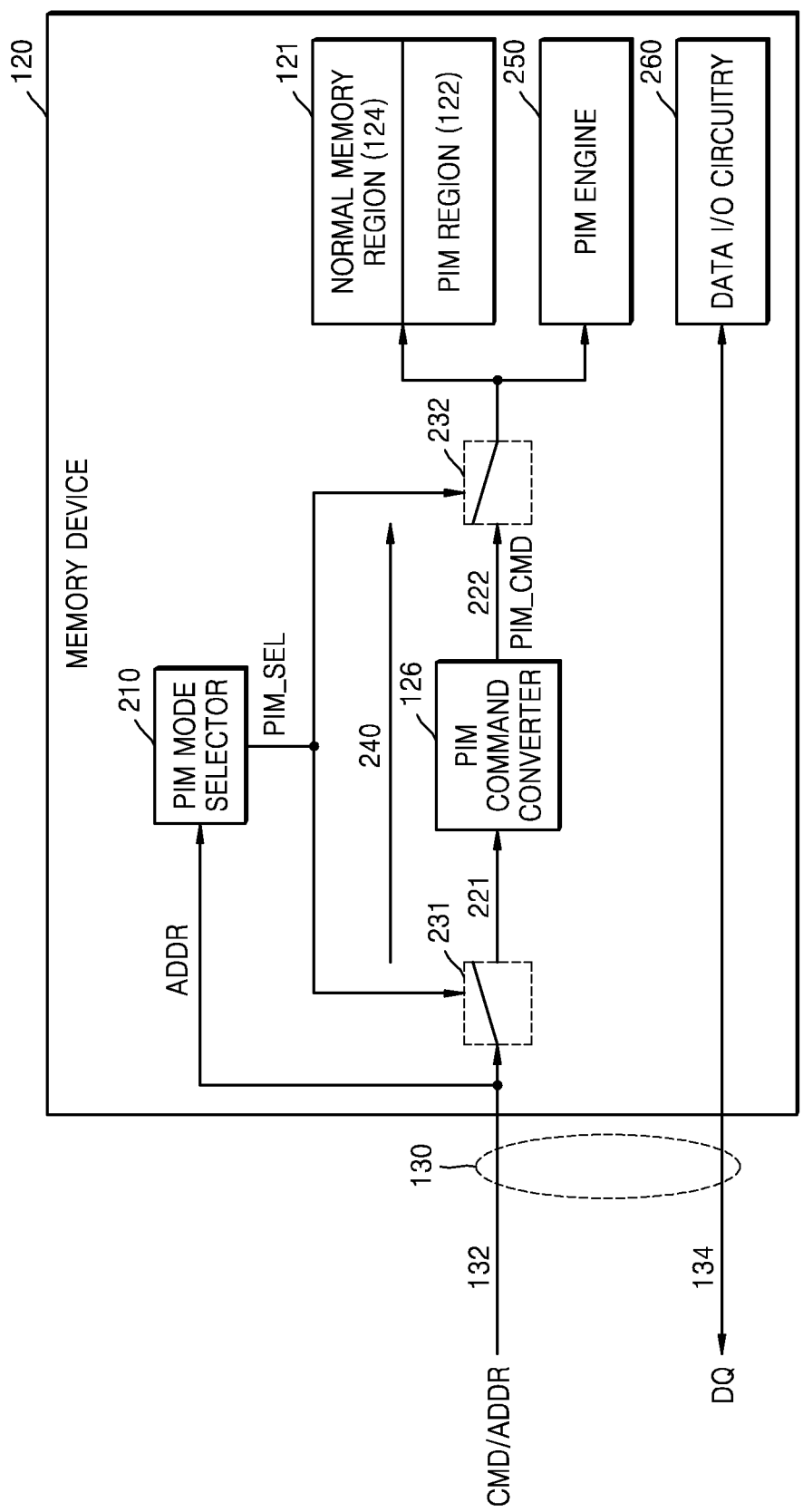
FIG. 2 is a block diagram for describing a memory device according to an exemplary embodiment of the inventive concept.

FIG. 2 is a block diagram for describing a memory device according to an exemplary embodiment of the inventive concept.

Referring to FIGS. 1 and 2, the memory device 120 includes the memory cell array 121 including the PIM region 122 and the normal memory region 124, the PIM command converter 126, a PIM mode selector 210 (e.g., logic circuit), a first switch 231, a second switch 232, a PIM engine 250 (e.g., a processor or logic circuit), and a data input/output circuit 260.

In the memory cell array 121, the PIM region 122 may be a region defined to access (e.g., to store) and output internal processing data for an internal processing operation when the memory device 120 operates in the internal processing mode. The normal memory region 124 may be a region defined to access data according to a general data transaction operation when the memory device 120 operates in the normal mode. The PIM region 122 and the normal memory region 124 may be set as fixed regions in the memory cell array 121. In an exemplary embodiment where the regions are fixed, their sizes and physical locations within the memory cell array 121 remain constant. According to embodiments, the PIM region 122 and the normal memory region 124 may be set as variable regions in the memory cell array 121. In an exemplary embodiment where the regions are variable, their sizes and physical locations within the memory cell array 121, their sizes and physical locations within the memory cell array 121 may dynamically change based on or more conditions.

When the memory device 120 operates in the internal processing mode, the PIM command converter 126 may convert the command CMD received through the command/address signal lines 132 into the internal processing operation command PIM_CMD.

The PIM mode selector 210 may receive the address ADDR from the memory controller 112 through the command/address signal lines 132 of the memory bus 130 and output a PIM mode selection signal PIM_SEL in response to the received address ADDR. The PIM mode selector 210 may determine whether a specific address is included in the received address ADDR and output the PIM mode selection signal PIM_SEL as a result of the determination. In an exemplary embodiment, the PIM mode selector 210 outputs a PIM mode selection signal PIM_SEL set to a first logic level to indicate the internal processing mode when the received address ADDR is within a predefined range of addresses and outputs the PIM mode selection signal PIM_SEL set to a second other logic level to indicate the normal mode when the received address ADDR is outside the predefined range of addresses. For example, the specific address may be an address within the range or the specific address itself.

In an exemplary embodiment, the specific address that the PIM mode selector 210 is aware of is the same as a specific address that is stored in the control register 116 of the memory controller 112 and used to address the PIM region 122. For example, one or more addresses may be stored in the control register 116 as the specific address. The PIM mode selection signal PIM_SEL serves as a control signal for determining whether the memory device 120 is to enter and operate in the internal processing mode or the normal mode. The specific address may alternately be stored outside the control register 116 within a memory of the memory controller 112 or within a memory of the host device 110 outside the memory controller.

The PIM mode selector 210 may activate the PIM mode selection signal PIM_SEL when a specific address is included in the address ADDR received through the command/address signal lines 132. By activating the PIM mode selection signal PIM_SEL, the memory device 120 may operate in the internal processing mode. The PIM mode selector 210 may deactivate the PIM mode selection signal PIM_SEL when no specific address is included in the address ADDR received through the command/address signal lines 132. For example, the PIM mode selection signal PIM_SEL may be activated by setting it the first logic level and deactivated by setting it to the second logic level. By deactivating the PIM mode selection signal PIM_SEL, the memory device 120 may operate in the normal mode. The PIM mode selection signal PIM_SEL may be provided to the first switch 231 and the second switch 232.

The first switch 231 may selectively connect the command/address signal lines 132 to input signal lines 221 or internal command signal lines 240 of the PIM command converter 126 in response to the PIM mode selection signal PIM_SEL. The second switch 232 may selectively connect output signal lines 222 or the internal command signal lines 240 of the PIM command converter 126 to the memory cell array 121 and the PIM engine 250 in response to the PIM mode selection signal PIM_SEL.

The first switch 231 may selectively connect the command/address signal lines 132 to the input signal lines 221 of the PIM command converter 126 in response to activation of the PIM mode selection signal PIM_SEL. The first switch 231 may provide the command CMD received through the command/address signal lines 132 to the PIM command converter 126. The PIM command converter 126 may convert the command CMD received through the input signal lines 221 into the internal processing operation command PIM_CMD and output the internal processing operation command PIM_CMD to the output signal lines 222. The internal processing operation command PIM_CMD may be a command associated with an internal processing operation performed in the internal processing mode.

The second switch 232 may connect output signal lines 221 of the PIM command converter 126 to the memory cell array 121 and/or the PIM engine 250 in response to activation of the PIM mode selection signal PIM_SEL. The second switch 232 may provide the internal processing operation command PIM_CMD output through the output signal lines 222 of the PIM command converter 126 to the PIM region 122 and/or the PIM engine 250 of the memory cell array 121. The PIM engine 250 may access the PIM region 122 according to the internal processing operation command PIM_CMD and perform an internal processing operation. For example, an internal processing operation may include a processing operation for internal processing data stored in the PIM region 122, e.g., data search, data arithmetic operation (e.g., add, subtract, multiple, divide, etc.), data move, data inversion, data shift, data swap, data comparison, logical operations, data processing/operations, etc.

The first switch 231 may connect the command/address signal lines 132 to the internal command signal lines 240 in response to deactivation of the PIM mode selection signal PIM_SEL and the command CMD received through the command/address signal lines 132 to the internal command signal lines 240. The command CMD provided to the internal command signal lines 240 may be a command associated with a data transaction operation performed in the normal mode.

The second switch 232 may connect the internal command signal lines 240 to the memory cell array 121 in response to deactivation of the PIM mode selection signal PIM_SEL. The normal memory region 124 of the memory cell array 121 may be accessed according to the command CMD provided to the internal command signal lines 240, and thus a data transaction operation may be performed. For example, the second switch 232 may connect the internal command signal lines 240 to the normal memory region 124 in response to deactivation of the PIM mode selection signal PIM_SEL.

When the memory device 120 operates in the internal processing mode, the PIM engine 250 may perform an internal processing operation according to the internal processing operation command PIM_CMD. The PIM engine 250 may perform an internal processing operation on internal processing data according to the internal processing operation command PIM_CMD by using the PIM region 122 of the memory cell array 121.

The PIM engine 250 is hardware having processing functionality, similar to a processor (e.g., a CPU) included in the host device 110. When the PIM engine 250 is referred to as an internal processor, the term "internal" means that the PIM engine 250 exists within the memory device 120. Therefore, a processor existing "outside" the memory device 120 may refer to, for example, a processor of the host device 110.

The data input/output circuit 260 may operate as a write driver (e.g., a driving circuit) or a sense amplifier of the memory device 120. The data input/output circuit 260 may receive the data DQ from the memory controller 112 through data lines 134 of the memory bus 130 and provide the received data DQ to the memory cell array 121 and/or the PIM engine 250. The data input/output circuit 260 may receive the data DQ from the memory cell array 121 and/or the PIM engine 250 and transmit the received data DQ to the memory controller 112 through the data lines 134.

When the memory device 120 operates in the internal processing mode, the PIM engine 250 may perform an internal processing operation. In this case, the PIM engine 250 may transmit/receive the data DQ to/from the memory controller 112 through the data input/output circuit 260 and the data lines 134.

For example, when the PIM engine 250 performs an internal processing operation in response to the internal processing operation command PIM_CMD, the data DQ received through the data lines 134 and the data input/output circuit 260 may be stored in the PIM region 122 of the memory cell array 121 as internal processing data. The PIM engine 250 may store internal processing data according to an internal processing operation performed in response to the internal processing operation command PIM_CMD in the PIM region 122. The PIM engine 250 may read internal processing data from the PIM region 122 according to the internal processing operation command PIM_CMD. The PIM engine 250 may perform an internal processing operation based on internal processing data read from the PIM region 122. The PIM engine 250 may transmit internal processing data processed through the internal processing operation to the memory controller 112 through the data input/output circuit 260 and the data lines 134.

An internal processing operation may be partly or mostly data exchange operations performed according to the internal processing operation command PIM_CMD. The data exchange operation may include an operation for reading internal processing data used for an internal processing operation (e.g., reference data, source data, destination data, or target data) from the PIM region 122 and/or an operation for writing a result of an internal processing operation to the PIM region 122. For example, it will be assumed that the PIM engine 250 performs an internal processing operation like a data search, a data move, a data arithmetic operation (e.g., add, subtract, multiple, divide, etc.), and a data swap according to the internal processing operation command PIM_CMD.

When the internal processing operation command PIM_CMD is a command for a data search, the PIM engine 250 may search for whether internal processing data corresponding to the data search is stored in the PIM region 122. The PIM engine 250 may output hit/miss information and/or corresponding address information as a result of a data search operation. The PIM engine 250 may write the hit/miss information or the corresponding address information associated with the data search operation to the PIM region 122. For example, the hit/miss information could be a first value to indicate the data is present in the PIM region 122 and a second other value to indicate the data is not present in the PIM region 122. For example, the address information could be set to physical address of the data within the PIM region 122 when the data is present and set to an invalid address (e.g., −1) when the data is not present.

When the internal processing operation command PIM_CMD is a command for a data move, the PIM engine 250 may move data corresponding to reference address information in the PIM region 122 to a target region. The PIM engine 250 may output address information of the region to which the data is moved as a result of the data move operation. The data move operation by the PIM engine 250 and an operation for writing address information regarding the region to which the data is moved may be performed in the PIM region 122. The target region could the PIM region 122 or the normal memory region 124. For example, the data move operation could move data stored in a first location of the PIM region 122 to a second other location within the PIM region 122 or the normal memory region 124.

When the internal processing operation command PIM_CMD is a command for a data add, the PIM engine 250 may read data corresponding to the reference address information from the PIM region 122, add internal processing data to the read data to generate a sum, and store the added data (e.g., the sum) in the PIM region 122. The PIM engine 250 may output address information regarding a region in which the added data is stored as a result of a data add operation. The data add operation by the PIM engine 250 and an operation for writing address information regarding the region in which the added data is stored may be performed in the PIM region 122. In an alternate embodiment, the internal processing operation command PIM_CMD is a command for one of various arithmetic operations such as a data subtract, a data multiple, or a data divide. For example, internal processing data may be subtracted from the read data, multiplied by the read data, or the read data may be divided by the internal processing data.

When the internal processing operation command PIM_CMD is a command for a data swap, the PIM engine 250 may read first data and second data respectively corresponding to first reference address information and second reference address information from the PIM region 122, swap the first data and the second data with each other, and store swapped first and second data in memory cells corresponding to the first reference address information and the second reference address information of the PIM region 122. The data swap operation by the PIM engine 250 may be performed in the PIM region 122.

When the memory device 120 operates in the normal mode, the data input/output circuit 260 may receive the data DQ received from the memory controller 112 through the data lines 134, store (write) the data DQ in the normal memory region 124 of the memory cell array 121, and transmit data read from the normal memory region 124 to the memory controller 112 through the data lines 134. The memory device 120 may perform a data transaction operation by using the normal memory region 124.

Figure 3:
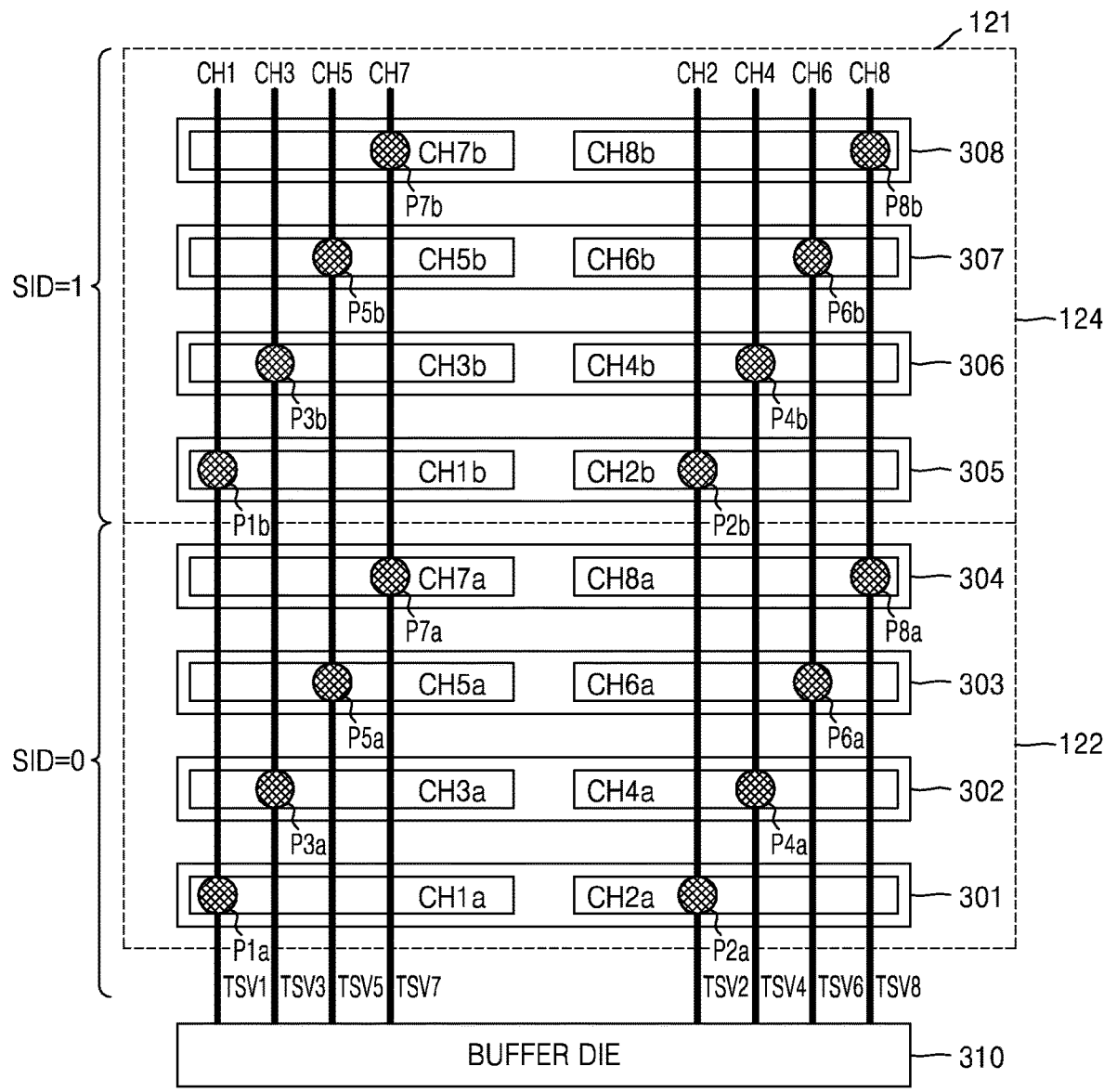
FIGS. 3 to 5 are diagrams for describing a portion of a structure of the memory device of FIG. 2.

FIG. 3 is a diagram for describing a portion of a structure of the memory device of FIG. 2.

Referring to FIGS. 2 and 3, the memory device 120 includes a plurality of stacked memory layers 301 to 308. For example, the memory device 120 may be an HBM. The memory layers 301 to 308 may be referred to as core dies. The memory layers 301 to 308 may constitute a plurality of independent interfaces called channels. The memory layers 301 to 308 may each include two channels. For conceptual description of the inventive concept and simplification of the drawings, FIG. 3 shows an example configuration in which odd-numbered channels (e.g., CH1a, CH3a, CH5a, CH7a, CH1b, CH3b, CH5b, and CH7b) are arranged on the left side of the memory layers 301 to 308 and even-numbered channels (e.g., CH2a, CH4a, CH6a, CH8a, CH2b, CH4b, CH6b, and CH8b) are arranged on the right side of the memory layers 301 to 308, but the arrangement of the memory layers 301 to 308 according to the inventive concept is not limited thereto.

For example, a first memory layer 301 may include a channel CH1a and a channel CH2a, a second memory layer 302 may include a channel CH3a and a channel CH4a, a third memory layer 303 may include a channel CH5a and a channel CH6a, and a fourth memory layer 304 may include a channel CH7a and a channel CH8a. A fifth memory layer 305 may include a channel CH1b and a channel CH2b, a sixth memory layer 306 may include a channel CH3b and a channel CH4b, a seventh memory layer 307 may include a channel CH5b and a channel CH6b, and an eighth memory layer 308 may include a channel CH7b and a channel CH8b. In the present embodiment of FIG. 3, an example of the memory device 120 is illustrated as in which eight memory layers 301 to 308 are stacked. However, the inventive concept is not limited thereto. According to embodiments, various numbers of memory layers (e.g., 2, 4, etc.) may be stacked in the memory device 120.

The memory device 120 may further include a buffer die 310 below the stacked memory layers 301 to 308. The buffer die 310 may be referred to as a memory buffer. The buffer die 310 may include an input buffer (or a receiver) that receives the clock signal CK, the command CMD, the address ADDR, and the data DQ from the memory controller 112 (FIG. 1). The buffer die 310 may provide a signal distribution function and a data input/output function with respect to channels CH1a, CH2a, CH3a, CH4a, CH5a, CH6a, CH7a, CH8a, CH1b, CH2b, CH3b, CH4b, CH5b, CH6b, CH7b, and CH8b through silicon vias TSV1 to TSV8. The buffer die 310 may communicate with the memory controller 112 through conductive units like bumps or solder balls formed on an outer surface of the memory device 120.

The buffer die 310 may include the PIM command converter 126, the PIM mode selector 210, the first switch 231, the second switch 232, the PIM engine 250 and the data input/output circuit 260 described above with reference to FIG. 2.

The stacked memory layers 301 to 308 may correspond to the memory cell array 121 including the PIM region 122 and the normal memory region 124 described above with reference to FIG. 2. Lower four memory layers 301 to 304 from among the stacked memory layers 301 to 308 may be allocated to the PIM region 122, whereas upper four memory layers 305 to 308 may be allocated to the normal memory region 124. According to exemplary embodiment of the inventive concept, the lower four memory layers 301 to 304 from among the stacked memory layers 301 to 308 are allocated to the normal memory region 124, and the upper four memory layers 305 to 308 are allocated to the PIM region 122.

The memory layers 301 to 304 of the PIM region 122 and the memory layers 305 to 308 of the normal memory region 124 may form common channels CH1 to CH8 through the through silicon vias TSV1 to TSV8 and electrode pads P1a, P2a, P3a, P4a, P5a, P6a, P7a, P8a, P1b, P2b, P3b, P4b, P5b, P6b, P7b, and P8b that are electrically connected to the through silicon vias TSV1 to TSV8. For simplicity of the drawings, the electrode pads P1a, P2a, P3a, P4a, P5a, P6a, P7a, P8a, P1b, P2b, P3b, P4b, P5b, P6b, P7b, and P8b are shown as circles. It may be understood that the electrode pads P1a, P2a, P3a, P4a, P5a, P6a, P7a, P8a, P1b, P2b, P3b, P4b, P5b, P6b, P7b, and P8b are electrically connected to the through silicon vias TSV1 to TSV8, respectively.

For example, the channel CH1a of the first memory layer 301 may be connected to through silicon vias TSV1 through an electrode pad P1a, and a channel CH1b of the fifth memory layer 305 may be connected to the through silicon vias TSV1 through an electrode pad P1b. The channel CH1a and the channel CH1b electrically connected to the through silicon vias TSV1 may form a first common channel CH1. Also, a channel CH2a of the first memory layer 301 may be connected to through silicon vias TSV2 through an electrode pad P2a, and a channel CH2b of the fifth memory layer 305 may be connected to the through silicon vias TSV2 through an electrode pad P2b. The channel CH2a and the channel CH2b electrically connected to the through silicon vias TSV2 may form a second common channel CH2.

A channel CH3a of the second memory layer 302 may be connected to through silicon vias TSV3 through an electrode pad P3a, and a channel CH3b of the sixth memory layer 306 may be connected to the through silicon vias TSV3 through an electrode pad P3b. The channel CH3a and the channel CH3b electrically connected to the through silicon vias TSV3 may form a third common channel CH3. Also, a channel CH4a of the second memory layer 302 may be connected to through silicon vias TSV4 through an electrode pad P4a, and a channel CH4b of the sixth memory layer 306 may be connected to the through silicon vias TSV4 through an electrode pad P4b. The channel CH4a and the channel CH4b electrically connected to the through silicon vias TSV4 may form a fourth common channel CH4.

A channel CH5a of the third memory layer 303 may be connected to through silicon vias TSV5 through an electrode pad P5a, and a channel CH5b of the seventh memory layer 307 may be connected to the through silicon vias TSV5 through an electrode pad P5b. The channel CH5a and the channel CH5b electrically connected to the through silicon vias TSV5 may form a fifth common channel CH5. Also, a channel CH6a of the third memory layer 303 may be connected to through silicon vias TSV6 through an electrode pad P6a, and a channel CH6b of the seventh memory layer 307 may be connected to the through silicon vias TSV6 through an electrode pad P6b. The channel CH6a and the channel CH6b electrically connected to the through silicon vias TSV6 may form a sixth common channel CH6.

A channel CH7a of the fourth memory layer 304 may be connected to through silicon vias TSV7 through an electrode pad P7a, and a channel CH7b of the eighth memory layer 308 may be connected to the through silicon vias TSV7 through an electrode pad P7b. The channel CH7a and the channel CH7b electrically connected to the through silicon vias TSV7 may form a seventh common channel CH7. Also, a channel CH8a of the fourth memory layer 304 may be connected to through silicon vias TSV8 through an electrode pad P8a, and a channel CH8b of the eighth memory layer 308 may be connected to the through silicon vias TSV8 through an electrode pad P8b. The channel CH8a and the channel CH8b electrically connected to the through silicon vias TSV8 may form an eighth common channel CH8.

First to eighth common channels CH1 to CH8 of the memory cell array 121 may be connected to the buffer die 310. In the first to eighth common channels CH1 to CH8, the PIM region 122 and the normal memory region 124 may be selectively accessed according to a stack identification signal SID that distinguishes the lower memory layers 301 to 304 and the upper memory layers 305 to 308. For example, when the stack identification signal SID is logic "0", the lower memory layers 301 to 304 (i.e., the PIM region 122) from among the first through eighth common channels CH1 to CH8 may be accessed. When the stack identification signal SID is logic "1", the upper memory layers 305 to 308 (i.e., the normal memory region 124) from among the first through eighth common channels CH1 to CH8 may be accessed.

As described above with reference to FIG. 2, when the memory device 120 operates in the internal processing mode, the PIM region 122 may be accessed. In an exemplary embodiment, when the stack identification signal SID set to a logic "0" is included in the address ADDR received through the command/address signal lines 132 of the memory bus 130 and the PIM mode selection signal PIM_SEL is activated by the PIM mode selector 210, the memory device 120 operates in the internal processing mode. Since the PIM mode selection signal PIM_SEL is activated, the memory device 120 may access the PIM region 122 and operate in the internal processing mode.

When the memory device 120 operates in the normal mode, the normal memory region 124 may be accessed. In an exemplary embodiment, when the stack identification signal SID offset to a logic "1" is included in the address ADDR received through the command/address signal lines 132 of the memory bus 130, and the PIM mode selection signal PIM_SEL is deactivated by the PIM mode selector 210, the memory device 120 operates in the normal mode. Since the PIM mode selection signal PIM_SEL is deactivated, the memory device 120 may access the normal memory region 124 and operate in the normal mode.

In the present embodiment, the stack identification signal SID may be a specific address, which is stored in the control register 116 and divides the memory cell array 121 of the memory controller 112 into the PIM region 122 and the normal memory region 124. Also, the stack identification signal SID may be a specific address used to address the PIM region 122 recognized by the PIM mode selector 210.

Figure 4:
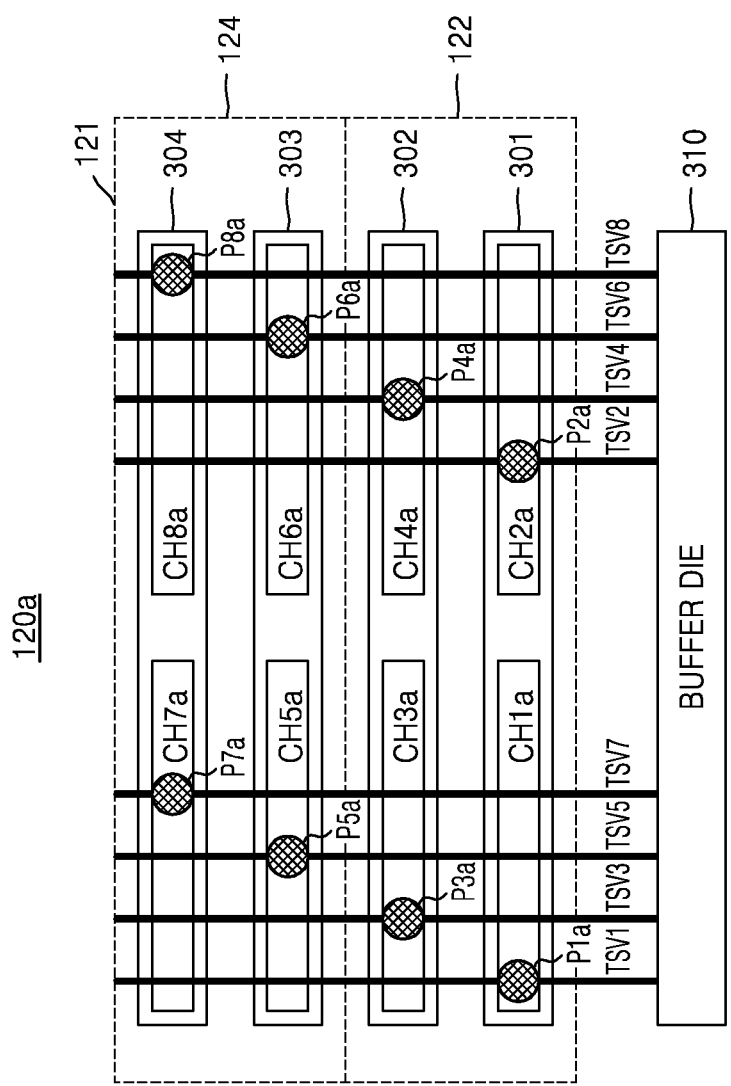

FIG. 4 is a diagram for describing a portion of a structure of the memory device of FIG. 2.

Referring to FIG. 4, a memory device 120a is different from the memory device 120 of FIG. 3 in that the memory cell array 121 includes first to fourth memory layers 301 to 304. Hereinafter, descriptions regarding the memory device 120a identical to those given above with reference to FIG. 3 will be omitted.

In the memory cell array 121 of the memory device 120a, first and second memory layers 301 and 302 may be allocated to PIM region 122, whereas third and fourth memory layers 303 and 304 may be allocated to the normal memory region 124. According to an exemplary embodiment of the inventive concept, the first and second memory layers 301 and 302 are allocated to the normal memory region 124, and the third and fourth memory layers 303 and 304 are allocated to the PIM region 122.

Eight channels CH1a to CH8a of the first through fourth memory layers 301 to 304 may be connected to the buffer die 310 through the through silicon vias TSV1 TSV8, respectively. The eight channels CH1a to CH8a may be addressed by a 3-bit channel address. When the most significant bit of a channel address is "0", channels CH1a, CH2a, CH3a, and CH4a of the first and second memory layers 301 and 302 may be selected. On the contrary, when the most significant bit of the channel address is "1", channels CH5a, CH6a, CH7a, and CH8a of the third and fourth memory layers 303 and 304 may be selected. As a result, the PIM region 122 and the normal memory region 124 may be selectively accessed according to the most significant bit of the channel address.

The most significant bit of the channel address is a specific address that divides the memory cell array 121 of the memory device 120a into the PIM region 122 and the normal memory region 124 and may be stored in the control register 116 of the memory controller 112. Also, the most significant bit of the channel address may be a specific address used to address the PIM region 122 recognized by the PIM mode selector 210.

Figure 5:
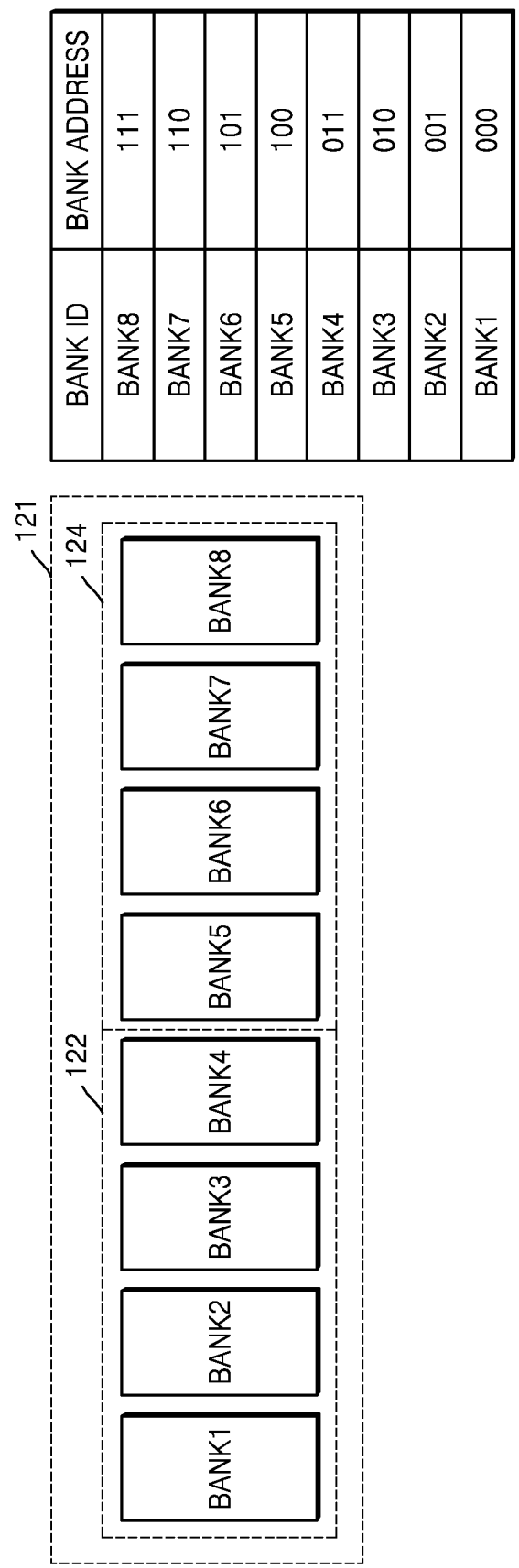

FIG. 5 is a diagram for describing a portion of a structure of a memory cell array of FIG. 2.

Referring to FIG. 5, the memory cell array 121 may include, for example, eight banks BANK1 to BANK8. First to fourth banks BANK to BANK4 may be allocated to the PIM region 122, and fifth to eighth banks BANK5 to BANK8 may be allocated to the normal memory region 124. The eight banks BANK1 to BANK8 may be addressed by a 3-bit bank address. When the most significant bit of a bank address is "0", the first to fourth banks BANK1 to BANK4 may be selected. On the contrary, when the most significant bit of the bank address is "1", the fifth to eighth banks BANK5 to BANK8 may be selected. As a result, the PIM region 122 and the normal memory region 124 may be selectively accessed according to the most significant bit of the bank address.

The most significant bit of the bank address is a specific address that divides the memory cell array 121 into the PIM region 122 and the normal memory region 124 and may be stored in the control register 116 of the memory controller 112. Also, the most significant bit of the bank address may be a specific address used to address the PIM region 122 recognized by the PIM mode selector 210.

The PIM region 122 and the normal memory region 124 described above with reference to FIGS. 3 to 5 are examples that are set as fixed regions in the memory cell array 121 by the stack identification signal SIDs, a channel address, or a bank address. Specific address information for setting the PIM region 122 and the normal memory region 124 as fixed regions may be statically set in the control register 116 of the memory controller 112.

According to embodiments of the inventive concept, the PIM region 122 and the normal memory region 124 are set as variable regions in the memory cell array 121 according to combinations of the stack identification signal SID, a channel address, and/or a bank address. Specific address information for setting the PIM region 122 and the normal memory region 124 as variable regions may be dynamically set in the control register 116 of the memory controller 112.

Figure 6:
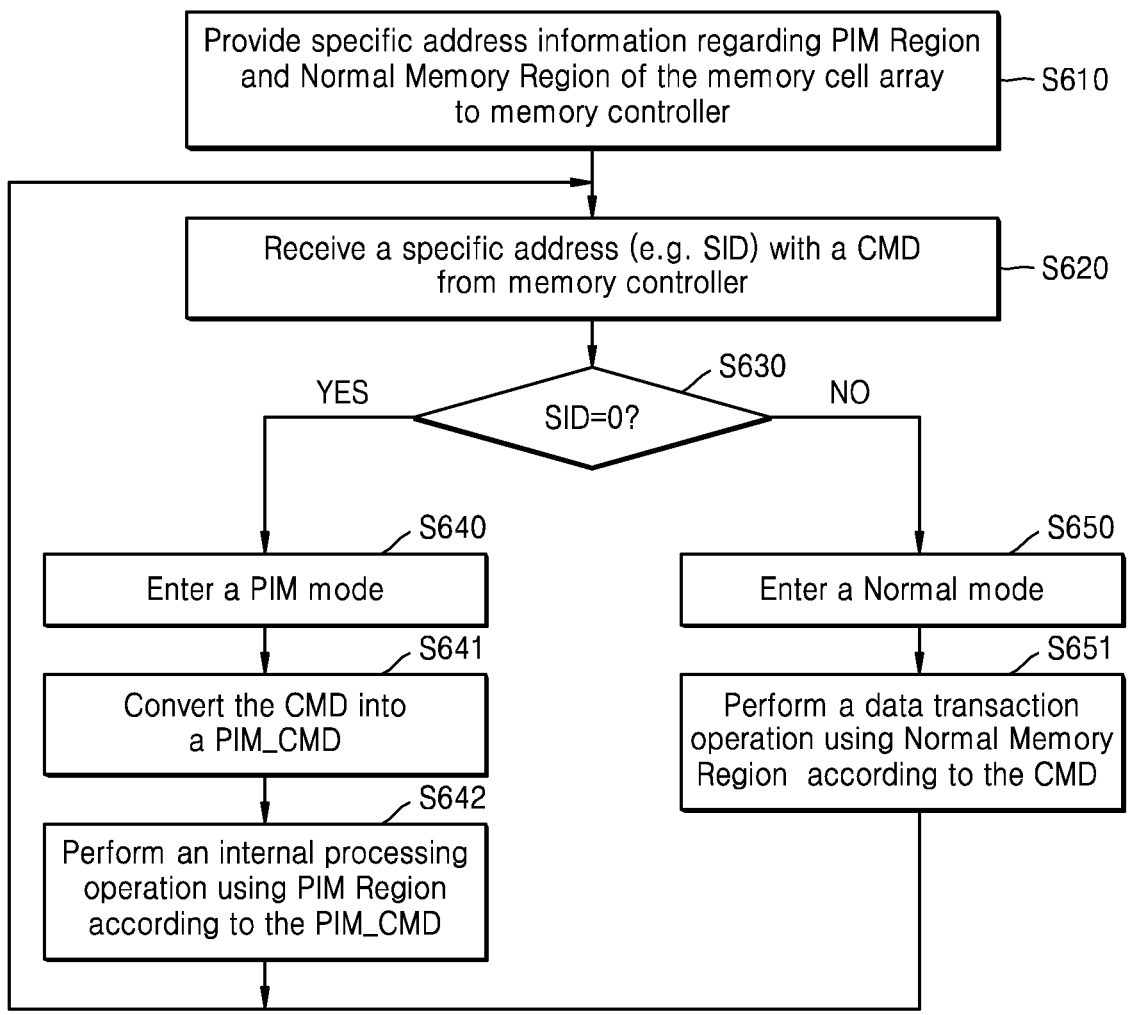
FIG. 6 is a flowchart for describing an operation of the memory device of FIG. 2 according to an exemplary embodiment of the inventive concept.

FIG. 6 is a flowchart for describing an operation of the memory device of FIG. 2 according to an exemplary embodiment of the inventive concept.

Referring to FIGS. 1, 2, and 6, in operation S610, the memory device 120 provides specific address information regarding the PIM region 122 and the normal memory region 124 of the memory cell array 121 to the memory controller 112. The specific address information may include specific addresses that divide the memory cell array 121 into a PIM region 122 and a normal memory region 124. The specific address is an address used to address the PIM region 122 and may include, for example, the stack identification signal SID, a channel address, and/or a bank address. The specific address information may be stored in the control register 116 of the memory controller 112.

In operation S620, the memory device 120 receives a specific address together with the command CMD from the memory controller 112 through the command/address signal lines 132. The memory controller 112 may issue the command CMD for accessing the memory device 120 based on a memory request of the host device 110. In this case, the command CMD and the specific address may be provided through the memory PHY 114, which supports the DDR protocol and/or the LPDDR protocol of the JEDEC standard, between the memory controller 112 and the memory device 120. For example, it is assumed that a specific address is the stack identification signal SID, as described above with reference to FIG. 3.

In operation S630, the memory device 120 determines whether the stack identification signal SID received as the specific address together with the command CMD in operation S620 addresses the PIM region 122 of the memory cell array 121. As described above with reference to FIG. 3, when the stack identification signal SID is provided as logic "0", the lower memory layers 301 to 304, that is, the PIM region 122, from among the first through eighth common channels CH1 to CH8 may be accessed. On the contrary, when the stack identification signal SID is provided as logic "1", the upper memory layers 305 to 308, that is, the normal memory region 124, from among the first through eighth common channels CH1 to CH8 may be accessed.

When the stack identification signal SID is logic "0", in operation S640, the memory device 120 enters the internal processing mode. The PIM mode selector 210 of the memory device 120 may activate the PIM mode selection signal PIM_SEL in response to the stack identification signal SID of logic "0". By activating the PIM mode selection signal PIM_SEL, the memory device 120 may operate in the internal processing mode.

In operation S641, the memory device 120 converts the command CMD received in operation S620 into the internal processing operation command PIM_CMD. The PIM command converter 126 of the memory device 120 may convert the received command CMD into the internal processing operation command PIM_CMD that instructs a type of an internal processing operation, e.g., data search, data arithmetic operation (e.g., add, subtract, multiple, divide, etc.), data move, data inversion, data shift, data swap, data comparison, logic operations, and/or data processing/operations.

In operation S642, the memory device 120 performs an internal processing operation according to the internal processing operation command PIM_CMD. The PIM engine 250 of the memory device 120 may perform an internal processing operation by using the PIM region 122 of the memory cell array 121 according to the internal processing operation command PIM_CMD. The PIM engine 250 may store internal processing data, which is a result of the internal processing operation performed in response to the internal processing operation command PIM_CMD, in the PIM region 122. Alternatively, the PIM engine 250 may read internal processing data from the PIM region 122 in response to the internal processing operation command PIM_CMD and perform an internal processing operation based on the read internal processing data. When the internal processing operation of operation S642 has completed, the memory device 120 may proceed to operation S620 and receive a next command CMD with a specific address.

In operation S640, when the stack identification signal SID is not logic "0", the memory device 120 enters the normal mode in operation S650. The PIM mode selector 210 of the memory device 120 may deactivate the PIM mode selection signal PIM_SEL in response to the stack identification signal SID of logic "1". By deactivating the PIM mode selection signal PIM_SEL, the memory device 120 may operate in the normal mode.

In operation S651, the memory device 120 performs a data transaction operation according to the command CMD received in operation S620. The command CMD may be associated with a data transaction operation performed in the normal mode. The memory device 120 may store (write) the data DQ received from the memory controller 112 through the data lines 134 in the normal memory region 124 of the memory cell array 121 according to the command CMD, read data from the normal memory region 124, and transmit the read data to the memory controller 112 through the data lines 134 as the data DQ. When the data transaction operation of operation S651 has completed, the memory device 120 may proceed to operation S620 and receive a next command CMD with a specific address.

Figure 7:
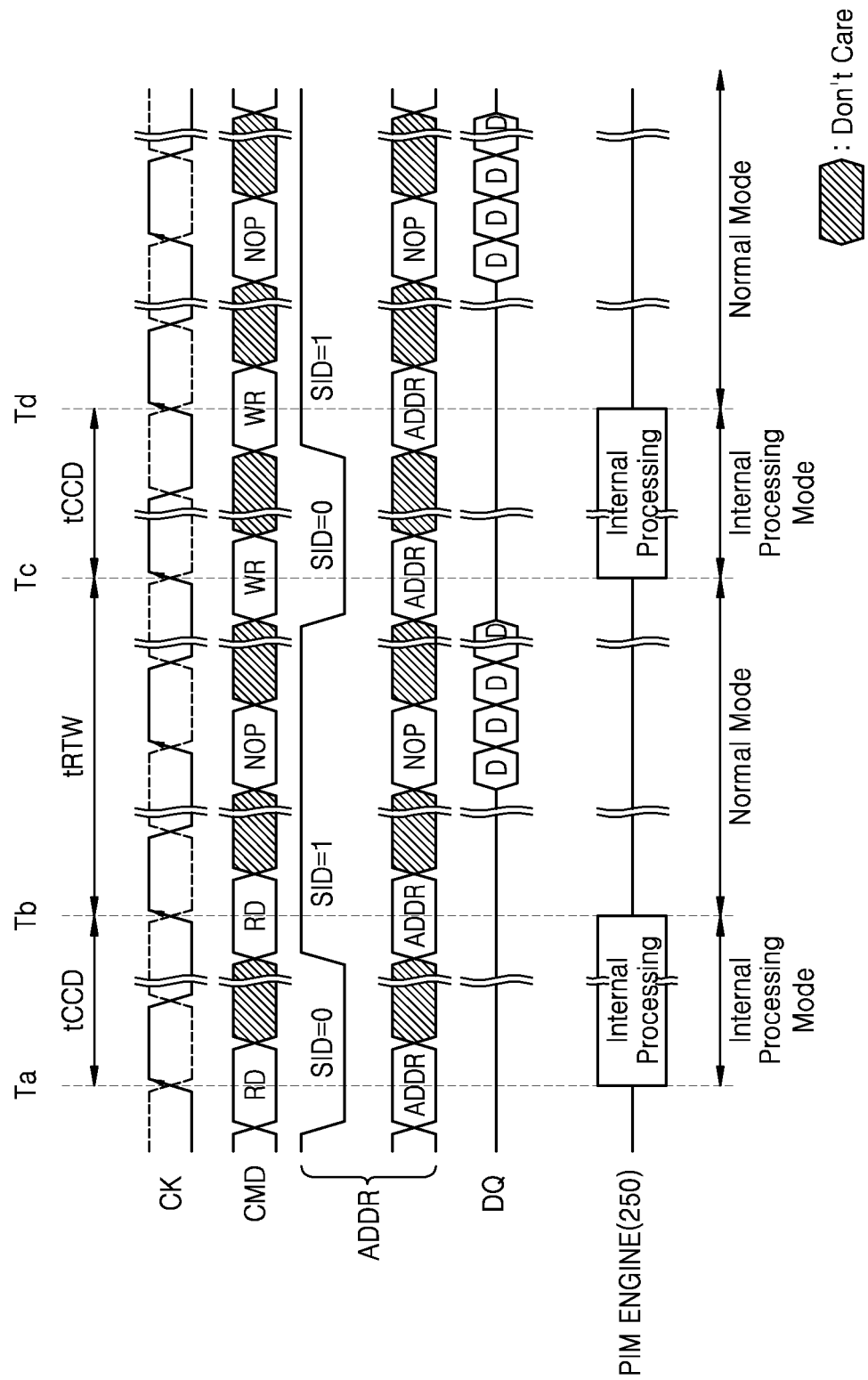
FIG. 7 is a timing diagram for describing an operation of a memory device of FIG. 2 according to an exemplary embodiment of the inventive concept.

FIG. 7 is a timing diagram for describing an operation of a memory device of FIG. 2. FIG. 7 shows a timing diagram of an operation based on the clock signal CK according to the DDR protocol and/or the LPDDR protocol. For simplicity of the drawing and convenience of explanation, FIG. 7 conceptually shows a write operation and a read operation in which the data DQ is input/output to/from the memory device 120 through the data lines 134.

Referring to FIGS. 1, 2, and 7, at a time point Ta, the memory device 120 receives the address ADDR including the stack identification signal SID from the memory controller 112 together with a read command RD. At this time, the stack identification signal SID is set to logic "0". Although not shown, an active command associated with the read command RD may be received from the memory controller 112 before the time point Ta.

In response to logic "0" of the stack identification signal SID at the time point Ta, the memory device 120 enters the internal processing mode. In the internal processing mode, the read command RD is converted into an internal processing read command by the PIM command converter 126, and the PIM engine 250 reads internal processing data written to memory cells corresponding to the address ADDR in the PIM region 122 of the memory cell array 121 according to the internal processing read command and performs an internal processing operation by using the read internal processing data. The present embodiment shows a case in which the internal processing data read from the PIM region 122 is not transmitted to the memory controller 112 outside the memory device 120. According to another embodiment, internal processing data processed by the PIM engine 250 is transmitted to the memory controller 112 as the data DQ through the data lines 134 of the memory bus 130.

At a time point Tb, the memory device 120 receives the address ADDR including the stack identification signal SID from the memory controller 112 together with the read command RD. At this time, the stack identification signal SID is set to logic "1".

In response to logic "1" of the stack identification signal SID at the time point Tb, the memory device 120 enters the normal mode. In the normal mode, the memory device 120 reads data D written to memory cells corresponding to the address signal ADDR in the normal memory region 124 of the memory cell array 121 according to the read command RD. The read data D may be transmitted to the memory controller 112 as the data DQ through the data lines 134 of the memory bus 130.

At a time point Tc, the memory device 120 receives the address ADDR including the stack identification signal SID from the memory controller 112 together with a write command WR. At this time, the stack identification signal SID is set to a logic "0".

In response to logic "0" of the stack identification signal SID at the time point Tc, the memory device 120 enters the internal processing mode. In the internal processing mode, the write command WR is converted into an internal processing write command by the PIM command converter 126, and the PIM engine 250 writes internal processing data obtained as a processing result of performing an internal processing operation to memory cells corresponding to the address ADDR in the PIM region 122 of the memory cell array 121 according to the internal processing write command.

At a time point Td, the memory device 120 receives the address ADDR including the stack identification signal SID from the memory controller 112 together with the write command WR. At this time, the stack identification signal SID is set to a logic "1".

In response to logic "1" of the stack identification signal SID at the time point Td, the memory device 120 enters the normal mode. In the normal mode, the memory device 120 writes data D to memory cells corresponding to the address signal ADDR in the normal memory region 124 of the memory cell array 121 according to the write command WR. Here, the data D to be written may be received from the memory controller 112 as the data DQ through the data lines 134 of the memory bus 130.

A timing parameter called CAS-to-CAS delay tCCD, which is the minimum time interval needed between successive read commands, exists between the read command RD at the time point Ta and the read command RD at the time point Tb. Also, a timing parameter tCCD, which is the minimum time interval needed between successive write commands, exists between the write command WR at the time point Tc and the write command WR at the time point Td. The timing parameter tCCD between the time point Ta and the time point Tb may satisfy the tCCD timing parameter requirements defined in the DDR specification and/or the LPDDR specifications of the JEDEC standard. Also, the timing parameter tCCD between the time point Tc and the time point Td may satisfy the tCCD timing parameter requirements defined in the DDR specification and/or the LPDDR specifications of the JEDEC standard.

A timing parameter called Read-to-Write delay tRTW exists between the read command RD at the time point Tb and the write command WR at the time point Tc. The timing parameter tRTW between the time point Tb and the time point Tc may satisfy the tRTW timing parameter requirements defined in the DDR specification and/or the LPDDR specifications of the JEDEC standard.

Figure 8:
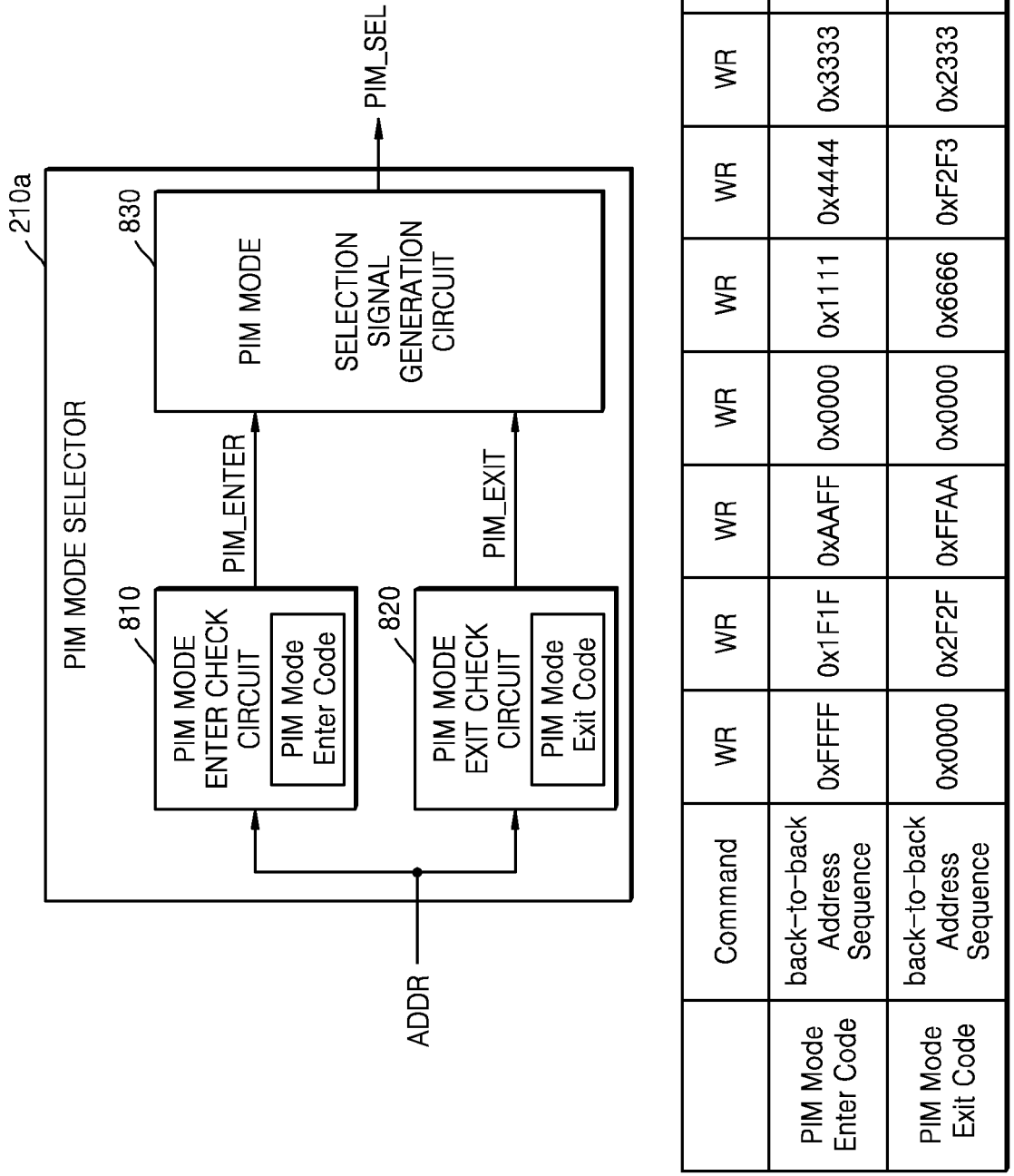
FIG. 8 is a diagram for describing a PIM mode selector of FIG. 2 according to an exemplary embodiment of the inventive concept.

FIG. 8 is a diagram for describing a PIM mode selector of FIG. 2.

Referring to FIG. 8, compared with the PIM mode selector 210 of FIG. 2, a PIM mode selector 210a determines whether addresses ADDRs received together with the command CMD coincide with a PIM mode entering code and whether the addresses ADDRs coincide with a PIM mode exiting code, instead of determining whether the addresses ADDRs received through the command/address signal lines 132 of the memory bus 130 together with the command CMD include a specific address used to address the PIM region 122.

The PIM mode selector 210a includes a PIM mode entering check circuit 810, a PIM mode exit check circuit 820, and a PIM mode selection signal generation circuit 830.

The PIM mode entering check circuit 810 may store a PIM mode entering code, compare bit values of the addresses ADDRs sequentially received by the PIM mode selector 210a with bit values of the PIM mode entering code, and, as a result of the comparison, output a PIM mode entering signal PIM_ENTER. When the bit values of the sequential addresses ADDRs coincide with the bit values of the PIM mode entering code, the PIM mode entering check circuit 810 may output the PIM mode entering signal PIM_ENTER of logic "1". Otherwise, the PIM mode entering check circuit 810 may output the PIM mode entering signal of logic "0". The PIM mode entering signal PIM_ENTER may be provided to the PIM mode selection signal generation circuit 830.

In the PIM mode entering code, for example, bit values of addresses respectively corresponding to sequential write commands WR may be set as a back-to-back address sequence, e.g., 0xFFFF, 0x1F1F, 0xAAFF, 0x0000, 0x1111, 0x4444, 0x3333, and 0x0000. For example, if the memory controller 112 transmits a first write command along with a first address of 0xFFFF at time 1, a second write command along with a second address of 0x1F1F at time 2, transmits a third write command along with a third address of 0xAAFF at time 3, transmits a fourth write command along with a fourth address of 0x0000 at time 4, a fifth write command along with a fifth address of 0x1111 at time 5, transmits a sixth write command along with a sixth address of 0x4444 at time 6, transmits a seventh write command along with a seventh address of 0x3333 at time 7, and transmits an eight write command along with an eighth address of 0x0000 at time 8, the PIM mode selector 210a may interpret receipt of such a sequence (i.e., the back-to-back-address) as instructing it to output the PIM mode entering signal PIM_ENTER of logic "1". While the above describes a sequence of 8 pairs of commands and addresses to send the back-to-back address representing the PIM Mode Enter Code, embodiments of the inventive concept are not limited thereto. For example, there may be less than 8 pairs or more than 8 pairs in alternate embodiments. Further, while the above describes use of bit values 0xFFFF, 0x1F1F, 0xAAFF, 0x0000, 0x1111, 0x4444, 0x3333, and 0x0000, embodiments of the inventive concept are not limited thereto. For example, the bit values may have different values in alternate embodiments.

The PIM mode exit check circuit 20 may store a PIM mode exiting code, compare bit values of the addresses ADDRs sequentially received by the PIM mode selector 210a with bit values of the PIM mode exiting code, and, as a result of the comparison, output a PIM mode exiting signal PIM_EXIT. When the bit values of sequential addresses ADDRs coincide with the bit values of the PIM mode exiting code, the PIM mode exit check circuit 20 may output the PIM mode exiting signal PIM_EXIT of logic "1". Otherwise, the PIM mode exit check circuit 20 may output the PIM mode exiting signal PIM_EXIT of logic "0". The PIM mode exiting signal PIM_EXIT may be provided to the PIM mode selection signal generation circuit 830.

In the PIM mode exiting code, for example, bit values of addresses respectively corresponding to the sequential write commands WR may be set as a back-to-back address sequence, e.g., 0x0000, 0x2F2F, 0xFFAA, 0x0000, 0x6666, 0xF2F3, 0x2333, and 0xFFFF. For example, if the memory controller 112 transmits a ninth write command along with a ninth address of 0x0000 at time 9, a tenth write command along with a tenth address of 0x2F2F at time 10, transmits an eleventh write command along with an eleventh address of 0xFFAA at time 11, transmits a twelfth write command along with a twelfth address of 0x0000 at time 12, a thirteenth write command along with a thirteenth address of 0x6666 at time 13, transmits a fourteenth write command along with a fourteenth address of 0xF2F3 at time 14, transmits a fifteenth write command along with a fifteenth address of 0x2333 at time 15, and transmits a sixteenth write command along with a sixteenth address of 0xFFFF at time 16, the PIM mode selector 210a may interpret receipt of such a sequence (i.e., the back-to-back-address) as instructing it to output the PIM mode exiting signal PIM_EXIT of logic "0". While the above describes a sequence of 8 pairs of commands and addresses to send the back-to-back address representing the PIM Mode Exit Code, embodiments of the inventive concept are not limited thereto. For example, there may be less than 8 pairs or more than 8 pairs in alternate embodiments. Further, while the above describes use of bit values 0x0000, 0x2F2F, 0xFFAA, 0x0000, 0x6666, 0xF2F3, 0x2333, and 0xFFFF, embodiments of the inventive concept are not limited thereto. For example, the bit values may have different values in alternate embodiments The PIM mode selection signal generation circuit 830 may generate a PIM mode selection signal PIM_SEL based on the PIM mode entering signal PIM_ENTER and the PIM mode exiting signal PIM_EXIT. The PIM mode selection signal generation circuit 830 may activate the PIM mode selection signal PIM_SEL in response to the PIM mode entering signal PIM_ENTER of logic "1" and the PIM mode exiting signal PIM_EXIT of logic "0". By activating the PIM mode selection signal PIM_SEL, the memory device 120 may operate in the internal processing mode.

The PIM mode selection signal generation circuit 830 may deactivate the PIM mode selection signal PIM_SEL in response to the PIM mode entering signal PIM_ENTER of logic "0" or the PIM mode exiting signal PIM_EXIT of logic "1". By deactivating the PIM mode selection signal PIM_SEL, the memory device 120 may operate in the normal mode.

The PIM mode entering code and the PIM mode exiting code described above with reference to FIG. 8 are merely an example, and the inventive concept is not limited thereto. According to embodiments of the inventive concept, the PIM mode entering code and the PIM mode exiting code may be configured in various ways. The PIM mode entering code and the PIM mode exiting code may be stored in the control register 116 of the memory controller 112 and the PIM mode selector 210*a* as same code values.

Figure 9:
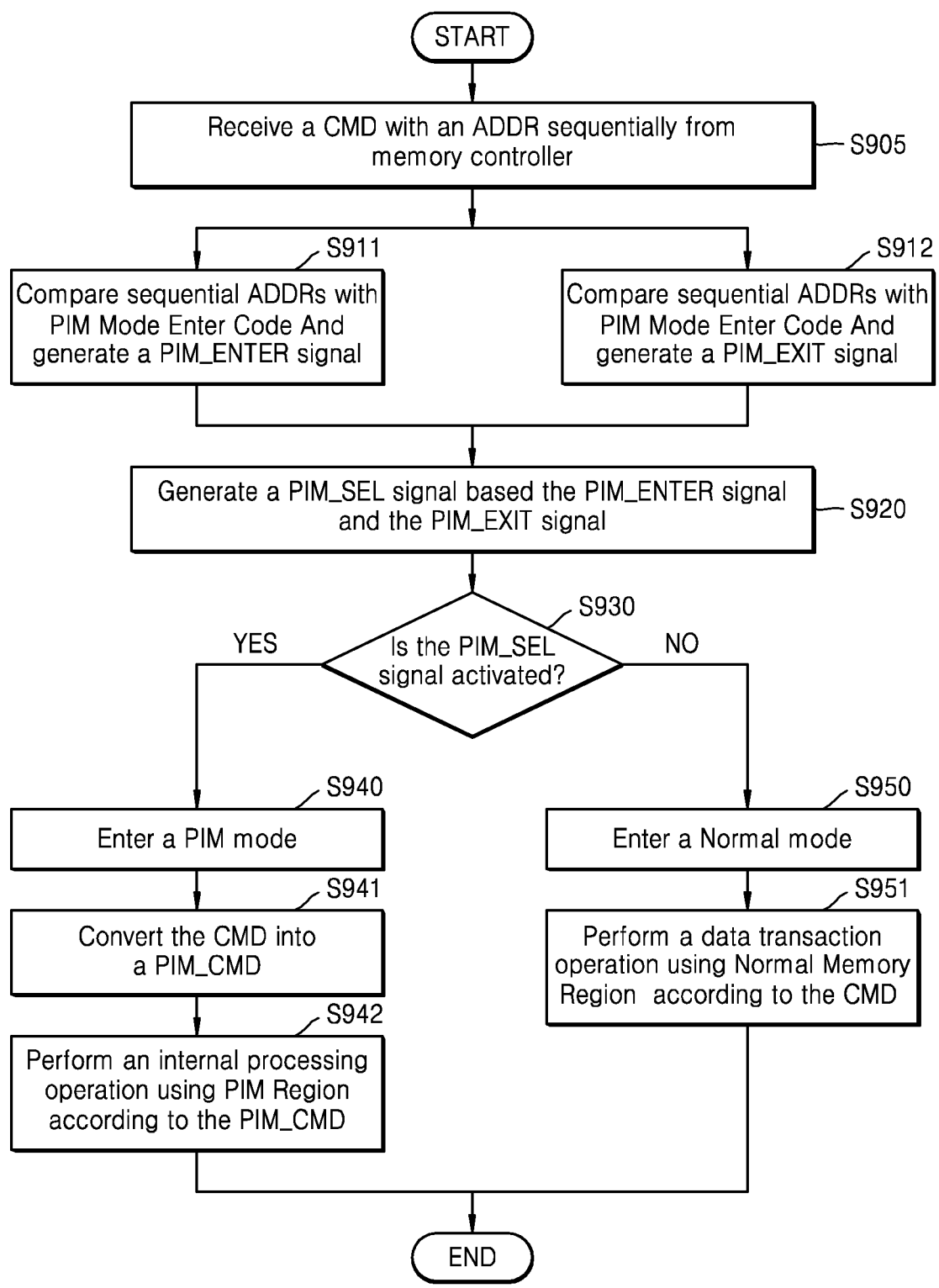
FIG. 9 is a flowchart for describing an operation of the memory device of FIG. 2 according to an exemplary embodiment of the inventive concept.

FIG. 9 is a flowchart for describing an operation of the memory device of FIG. 2 according to an exemplary embodiment of the inventive concept.

Referring to FIGS. 1, 2, 8, and 9, in operation S905, the memory device 120 sequentially receives the command CMD and the addresses ADDRs from the memory controller 112 through the command/address signal lines 132.

In operation S911, through the PIM mode entering check circuit 810 of the PIM mode selector 210*a*, the memory device 120 compares bit values of sequentially received addresses ADDRs with bit values of the PIM mode entering code, and, as a result of the comparison, outputs the PIM mode entering signal PIM_ENTER.

In operation S912, through the PIM mode exit check circuit 820 of the PIM mode selector 210*a*, the memory device 120 compares the bit values of the sequentially received addresses ADDRs with bit values of the PIM mode exiting code, and, as a result of the comparison, outputs the PIM mode exiting signal PIM_EXIT.

In operation S920, through the PIM mode selection signal generation circuit 830 of the PIM mode selector 210*a*, the memory device 120 generates the PIM mode selection signal PIM_SEL based on the PIM mode entering signal PIM_ENTER and the PIM mode exiting signal PIM_EXIT. For example, the PIM mode selection signal generation circuit 830 may activate the PIM mode selection signal PIM_SEL in response to the PIM mode entering signal PIM_ENTER of logic "1" and the PIM mode exiting signal PIM_EXIT of logic "0". The PIM mode selection signal generation circuit 830 may deactivate the PIM mode selection signal PIM_SEL in response to the PIM mode entering signal PIM_ENTER of logic "0" or the PIM mode exiting signal PIM_EXIT of logic "1".

In operation S930, the memory device 120 determines whether the PIM mode selection signal PIM_SEL generated in operation S920 is activated.

When the PIM mode selection signal PIM_SEL is activated, in operation S940, the memory device 120 enters the internal processing mode.

In operation S941, the memory device 120 converts the command CMD received in operation S920 into the internal processing operation command PIM_CMD. The PIM command converter 126 of the memory device 120 may convert the received command CMD into the internal processing operation command PIM_CMD that instructs a type of an internal processing operation, e.g., data search, data arithmetic operation (e.g., add, subtract, multiple, divide, etc.), data move, data inversion, data shift, data swap, data comparison, logic operations, and/or data processing/operations.

In operation S942, the memory device 120 performs an internal processing operation according to the internal processing operation command PIM_CMD. The PIM engine 250 of the memory device 120 may perform an internal processing operation by using the PIM region 122 of the memory cell array 121 according to the internal processing operation command PIM_CMD. The PIM engine 250 may store internal processing data, which is a result of an internal processing operation performed in response to the internal processing operation command PIM_CMD, in the PIM region 122. Alternatively, the PIM engine 250 may read internal processing data from the PIM region 122 in response to the internal processing operation command PIM_CMD and perform an internal processing operation based on the read internal processing data.

Meanwhile, when it is determined in operation S930 that the PIM mode selection signal PIM_SEL is deactivated, in operation S950, the memory device 120 enters the normal mode.

In operation S951, the memory device 120 performs a data transaction operation according to the command CMD received in operation S905. The command CMD may be associated with a data transaction operation performed in the normal mode. The memory device 120 may store the data DQ received from the memory controller 112 through the data lines 134 in the normal memory region 124 of the memory cell array 121 according to the command CMD, read the data DQ from the normal memory region 124, and transmit the read data to the memory controller 112 through the data lines 134 as the data DQ.

While the inventive concept has been particularly shown and described with reference to embodiments thereof, it will be understood that various changes in form and details may be made therein without departing from the spirit and scope of the inventive concept.

What is claimed is:

1. A memory device comprising:
a memory cell array including a first memory region and a second memory region;
a processing-in-memory (PIM) engine configured to perform an internal processing operation on the first memory region;
a mode selector circuit configured to activate a processing mode selection signal for controlling the memory device to enter an internal processing mode when first addresses are received sequentially along with sequential write commands and when bit values of the first addresses match bit values of a first back-to-back address sequence of a PIM mode entering code associated with the sequential write commands, the PIM mode entering code being stored in the mode selector circuit; and
a command converter circuit configured to convert a received command into a PIM command to perform the internal processing operation in response to the activation of the processing mode selection signal.

2. The memory device of claim 1, wherein the mode selector circuit is further configured to receive the first addresses sequentially and compare the PIM mode entering code with the first addresses to determine whether the bit values of the first addresses match the bit values of the first back-to-back address sequence of the PIM mode entering code.

3. The memory device of claim 1, wherein the command converter circuit is further configured convert a read command into an internal processing read command, and the PIM engine is further configured to read internal processing data from memory cells of the first memory region in response to the internal processing read command and perform the internal processing operation by using the read internal processing data.

4. The memory device of claim 1, wherein the command converter circuit is further configured to convert a write command into an internal processing write command, and the PIM engine is further configured to write internal processing data obtained as a processing result of performing the internal processing operation, to memory cells of the first memory region, in response to the internal processing write command.

5. The memory device of claim 1, wherein the mode selector circuit is further configured to store a PIM mode exiting code and deactivate the processing mode selection signal for controlling the memory device to exit the internal processing operation based on the PIM mode exiting code, and the PIM mode exiting code includes a second back-to-back address sequence associated with the sequential write commands.

6. The memory device of claim 5, wherein the mode selector circuit is further configured to receive second addresses sequentially, compare the PIM mode exiting code with the second addresses, and deactivate the processing mode selection signal when the sequential second addresses match second back-to-back address sequence of the PIM mode exiting code associated with the sequential write commands.

7. The memory device of claim 5, wherein the memory device enters a normal mode in response to the deactivation of the processing mode selection signal.

8. The memory device of claim 1, wherein the memory device supports a double data rate (DDR) protocol or a low power double data rate (LPDDR) protocol.

9. A method of operating a memory device including a memory cell array, the memory cell array including a first memory region and a second memory region, and a processing-in-memory (PIM) engine performing an internal processing operation, the method comprising:
  activating a processing mode selection signal for controlling the memory device to enter an internal processing mode operation when first addresses are received sequentially along with sequential writes commands and when bit values of the first addresses match bit values of a first back-to-back address sequence of a PIM mode entering code associated with the sequential write commands, the PIM mode entering code being stored in the memory device;
  converting a received command into an internal processing command in response to the activation of the processing mode selection signal; and
  performing, by the PIM engine, the internal processing operation on the first memory region in response to the internal processing command.

10. The method of claim 9, further comprising:
  receiving the first addresses sequentially; and
  comparing the back-to-back address sequence of the PIM mode entering code with the first addresses to determine whether the bit values of the first addresses match the bit values of PIM mode entering code.

11. The method of claim 9, further comprising:
  receiving a read command;
  converting the read command into an internal processing read command;
  reading internal processing data from memory cells of the first memory region in response to the internal processing read command; and
  performing, by the PIM engine, the internal processing operation by using the read internal processing data.

12. The method of claim 9, further comprising:
  receiving a write command; converting the write command into an internal processing write command; and
  writing internal processing data obtained as a processing result of the performing of the internal processing operation, to memory cells of the first memory region, in response to the internal processing write command.

13. The method of claim 9, further comprising deactivating the processing mode selection signal for controlling the memory device to exit the internal processing operation based on a PIM mode exiting code including a second back-to-back address sequence associated with the sequential write commands, the PIM mode exiting code being stored in the memory device.

14. The method of claim 13, further comprising:
  receiving second addresses sequentially;
  comparing the second back-to-back address sequence of the PIM mode exiting code with the second addresses; and
  deactivating the processing mode selection signal when the second addresses match the second back-to-back address sequence of the PIM mode exiting code.

15. The method of claim 13, further comprising entering a normal mode in response to the deactivation of the processing mode selection signal.

16. The method of claim 9, wherein the memory device supports a double data rate (DDR) protocol or a low power double data rate (LPDDR) protocol.

17. A memory system comprising:
  a memory device configured to perform an internal processing operation using a processing-in-memory (PIM) engine in an internal processing mode; and
  a memory controller configured to transmit first addresses sequentially along with sequential write commands to the memory device; and
  wherein the memory device comprises:
  a memory cell array including a first memory region and a second memory region;
  a mode selector circuit configured to store a PIM mode entering code that includes a first back-to-back address sequance associated with the sequential write commands, compare bit values of the first addresses with bit values of the first back-to-back address sequence of the PIM mode entering code, and activate a processing mode selection signal for controlling the memory device to enter the internal processing mode when the first addresses are received sequantially along with the sequential write commands and a result of the compare indicates the bit values of the first addresses match the bit values of the first back-to-back address sequence of the PIM mode entering code associated with the sequential write commands; and
  the PIM engine configured to perform the internal processing operation on the first memory region after entering the internal processing mode.

18. The memory system of claim 17, wherein the memory controller is further configured to transmit second addresses sequentially along with sequential write commands to the memory device, and the mode selector circuit is further configured to store a PIM mode exiting code associated with the sequential write commands, compare the second addresses with the PIM mode exiting code, and deactivate the processing mode selection signal for controlling the memory device to exit the internal processing mode when the second addresses match addresses of the PIM mode exiting code associated with the sequential write commands.

19. The memory system of claim 17, wherein the memory device further comprises a command converter circuit configured to convert a read command into an internal processing read command in the internal processing mode, and the PIM engine is further configured to read internal processing data from memory cells of the first memory region in response to the internal processing read command and perform the internal processing operation by using the read internal processing data.

20. The memory system of claim 19, wherein the command converter circuit is further configured to convert a write command into an internal processing write command in the internal processing mode, and the PIM engine is further configured to write internal processing data obtained as a processing result of performing the internal processing operation, to memory cells of the first memory region, in response to the internal processing write command.

* * * * *